(12) United States Patent
Doi et al.

(10) Patent No.: US 8,723,239 B2
(45) Date of Patent: May 13, 2014

(54) SOLID-STATE IMAGING ELEMENT

(75) Inventors: Hiroyuki Doi, Kyoto (JP); Ryohei Miyagawa, Kyoto (JP); Hitoshi Kuriyama, Osaka (JP)

(73) Assignee: Panasonic Corporation, Osaka (JP)

( * ) Notice: Subject to any disclaimer, the term of this patent is extended or adjusted under 35 U.S.C. 154(b) by 783 days.

(21) Appl. No.: 12/172,571

(22) Filed: Jul. 14, 2008

(65) Prior Publication Data

US 2009/0020795 A1 Jan. 22, 2009

(30) Foreign Application Priority Data

Jul. 18, 2007 (JP) ................................. 2007-186704

(51) Int. Cl.
*H01L 31/062* (2012.01)
*H01L 31/113* (2006.01)

(52) U.S. Cl.
USPC ............................. 257/292; 257/192; 438/57

(58) Field of Classification Search
USPC .................. 257/192, 292, E21.001, E31.001; 438/57
See application file for complete search history.

(56) References Cited

U.S. PATENT DOCUMENTS

| | | | | |
|---|---|---|---|---|
| 6,166,405 A * | 12/2000 | Kuriyama et al. | ............ | 257/290 |
| 6,252,286 B1 * | 6/2001 | Arai | ............................... | 257/446 |
| 6,846,694 B2 * | 1/2005 | Fukushima et al. | ............ | 438/57 |
| 6,861,686 B2 * | 3/2005 | Lee et al. | ........................ | 257/292 |
| 6,906,364 B2 | 6/2005 | Chen et al. | | |
| 7,544,530 B2 * | 6/2009 | Han | .................. | 438/48 |
| 7,667,178 B2 * | 2/2010 | Bae et al. | .................... | 250/208.1 |
| 2001/0041397 A1 * | 11/2001 | Fukushima | .................... | 438/162 |
| 2003/0137025 A1 * | 7/2003 | Rhodes | .......................... | 257/444 |
| 2004/0012021 A1 * | 1/2004 | Hosokawa et al. | .............. | 257/53 |
| 2005/0059177 A1 * | 3/2005 | Rhodes | .......................... | 438/22 |
| 2007/0057147 A1 * | 3/2007 | Kim | .............................. | 250/208.1 |
| 2007/0120161 A1 * | 5/2007 | Cole | .............................. | 257/292 |

FOREIGN PATENT DOCUMENTS

| | | |
|---|---|---|
| JP | 11-233750 | 8/1999 |
| JP | 2002-110953 | 4/2002 |
| JP | 2005-223019 | 8/2005 |
| JP | 2005-340475 | 12/2005 |
| JP | 2007-80926 | 3/2007 |

OTHER PUBLICATIONS

Report by Chipworks, "Sony ClearVid IMX013 CMOS Image Sensor 0.13 µm Copper CMOS Process Imager Process, Review (with Optional TEM and TEM-EDS Anyalysis)", Jun. 12, 2006, I-IV, 1-1-11, 5-1-24, Chipworks Incorporated, Ottawa, ON, Canada.

* cited by examiner

*Primary Examiner* — Phuc Dang
(74) *Attorney, Agent, or Firm* — McDermott Will & Emery LLP

(57) ABSTRACT

A solid-state imaging element includes a photodiode formed in an upper portion of a semiconductor substrate to perform a photoelectric conversion, a silicon dioxide film formed on the substrate to cover the photodiode, and a silicon nitride film formed on the silicon dioxide film. The silicon nitride film has a thinner portion smaller in thickness than at least an end portion of the silicon nitride film entirely or partly over the photodiode.

17 Claims, 10 Drawing Sheets

SOLID-STATE IMAGING ELEMENT

BACKGROUND OF THE INVENTION

The present invention relates to a solid-state imaging element such as, e.g., a CMOS image sensor and a method for fabricating the same. More particularly, the present invention relates to a solid-state imaging element comprising an antireflection film on a photodiode formed in a semiconductor substrate and a method for fabricating the same.

As a solid-state imaging element, a CMOS image sensor comprising a pixel portion and a peripheral CMOS logic circuit portion has been known. The CMOS image sensor has such advantages as a high quantum efficiency, a high dynamic range, and a random access so that it is easy to provide compatibility between the fabrication process thereof and a CMOS process. As a result, it is possible to form an A/D converter and various signal processing circuits in the same chip. In such a solid-state imaging element, trends toward a larger number of pixels and a smaller pixel size have been rapidly growing in recent years. As a result, it has become a significant challenge to maintain or improve the sensitivity.

In the solid-state imaging element, a photodiode is formed as a light receiving portion in a semiconductor substrate. Due to the refractivity difference between an interlayer insulating film (which is typically a silicon dioxide film) formed on the photodiode and silicon composing the semiconductor substrate, a part of incident light is reflected upward by the surface of the semiconductor substrate. As a result, the light reaching the photodiode decreases to result in degradation of the sensitivity. To prevent this, it has been known to, e.g., provide an antireflection film made of a silicon nitride film on a silicon substrate via a silicon dioxide film, thereby reducing a loss in incident light using a multiple interference effect, and improving the sensitivity.

As an example of a method for fabricating a CMOS image sensor, a method has been proposed which forms an antireflection film on a photodiode, while maintaining compatibility with a CMOS process, as will be described hereinbelow (see, e.g., U.S. Pat. No. 6,906,364 B2).

FIGS. 11A to 11E are principal-portion cross-sectional views sequentially showing the process steps of the conventional method for fabricating the solid-state imaging element disclosed in the U.S. patent mentioned above.

First, as shown in FIG. 11A, an isolation region 101 made of a silicon dioxide film is formed in a semiconductor substrate 100 having a photodiode region 100A composing a pixel portion, and a transistor region 100B composing a CMOS logic circuit portion. Subsequently, a silicon dioxide film 106 is formed by thermal oxidation on the semiconductor substrate 100, and then a polysilicon film 108 is formed by a reduced pressure CVD method.

Next, as shown in FIG. 11B, the silicon dioxide film 106 and the polysilicon film 108 are patterned by photolithographic and etching techniques to form a gate oxide film 106a and a gate electrode 108a. Subsequently, ion implantation 110 is performed to form a lightly doped impurity diffusion layer 112 in the area of the semiconductor substrate 100 located laterally and outwardly under the gate electrode 108a using the gate electrode 108a as a mask in the transistor region 100B, while simultaneously forming a lightly doped impurity diffusion layer 112 in the upper portion of the semiconductor substrate 100 in the photodiode region 100A.

Next, as shown in FIG. 11C, a silicon dioxide film or a silicon nitride film is deposited over the entire surface of the semiconductor substrate 100 using a reduced pressure CVD method, and then subjected to anisotropic etching to form sidewall spacers 114 on the side surfaces of gate electrode 108a. Subsequently, ion implantation 118 is performed to form source/drain diffusion layers 120 in the areas of the semiconductor substrate 100 located laterally and outwardly under the sidewall spacers 114 in the transistor region 100B, while simultaneously forming a heavily doped impurity diffusion layer 122 in the photodiode region 100A.

Next, as shown in FIG. 11D, a silicide formation preventing film 124 made of a silicon dioxide film is formed on the isolation region 101, and on the heavily doped impurity diffusion layer 122 in the photodiode region 100A. Subsequently, a silicide layer 126 is formed on each of the upper surfaces of the gate electrode 108a and the source/drain diffusion layers 120 by a salicidation method.

Next, as shown in FIG. 11E, a liner layer 128 made of a silicon nitride film is formed over the entire surface of the semiconductor substrate 100 including the photodiode region 100A and the transistor region 100B using a plasma CVD method. At this time, in the photodiode region 100A, the liner layer 128 made of the silicon nitride film has a refractivity different from that of the silicide formation preventing film 124 made of the silicon dioxide film, and functions as the antireflection film.

In the conventional method for fabricating the solid-state imaging element described above, the silicon dioxide film or the silicon nitride film composing each of the sidewall spacers 114 of the transistor is removed in the photodiode region 100A by dry etching during the formation of the sidewall spacers 114, as shown in FIG. 11C. As a result, during the dry etching in the process step, the surface roughening of the semiconductor substrate or the unexpected entrance of a metal impurity into the semiconductor substrate occurs at the surface of the photodiode to cause the problem of the degraded characteristics (a lower sensitivity, increased sensitivity variations, and an increased dark current) of the image sensor.

As shown in FIG. 11E, the liner layer 128 made of the silicon nitride film is used as the antireflection film in the photodiode region 100A. However, it is difficult in terms of fabrication to cause the film thickness (about 20 to 30 nm) required of the liner layer functioning as an etching stopper during, e.g., the formation of a contact hole in a CMOS fabrication process to coincide with the optimum film thickness (about 30 to 80 nm) required of the liner layer functioning as the antireflection film. This also leads to the problem that a sufficient antireflection effect cannot be obtained in the photodiode region 100A.

SUMMARY OF THE INVENTION

In view of the foregoing, it is therefore an object of the present invention to provide a solid-state imaging element having a structure which does not cause the degraded characteristics (a lower sensitivity, increased sensitivity variations, and an increased dark current) of an image sensor when a typical CMOS fabrication process is applied thereto, and a method for fabricating the same. Another object of the present invention is to provide a solid-state imaging element having a structure which allows the optimization of the thickness of an antireflection film formed on a photodiode without undergoing restrictions related to the fabrication process, and a method for fabricating the same.

To attain the object described above, a solid-state imaging element according to a first embodiment of the present invention includes: a photodiode formed in an upper portion of a semiconductor substrate to perform a photoelectric conversion; a first insulating film formed on the semiconductor substrate to cover the photodiode; and a second insulating film formed on the first insulating film, wherein the second insulating film has a thinner portion smaller in thickness than at least an end portion of the second insulating film entirely or partly over the photodiode.

The solid-state imaging element according to the first embodiment of the present invention further includes: a third insulating film formed on the second insulating film, and having an opening for entirely or partly exposing a portion of the second insulating film located over the photodiode.

In this case, the thinner portion of the second insulating film smaller in thickness than at least the end portion of the second insulating film is the portion of the second insulating film exposed in the opening.

A solid-state imaging element according to a second embodiment of the present invention includes: a photodiode formed in an upper portion of a semiconductor substrate to perform a photoelectric conversion; a transistor formed in a region of the semiconductor substrate electrically isolated from the photodiode, and having sidewall spacers on side surfaces of a gate electrode thereof; a first insulating film formed on the semiconductor substrate to cover the photodiode; and a second insulating film formed on the first insulating film, wherein the sidewall spacers are each made of a multilayer structure of the first and second insulating films formed in order of increasing distance from each of the side surfaces of the gate electrode.

In the solid-state imaging element according to the second embodiment of the present invention, the second insulating film has a thinner portion smaller in thickness than at least an end portion of the second insulating film entirely or partly over the photodiode.

The solid-state imaging element according to the second embodiment of the present invention further includes: a third insulating film formed over an entire surface of the semiconductor substrate to cover the transistor, and having an opening for entirely or partly exposing a portion of the second insulating film located over the photodiode.

In this case, the thinner portion of the second insulating film smaller in thickness than at least the end portion of the second insulating film is the portion of the second insulating film exposed in the opening.

In the solid-state imaging element according to the first or second embodiment of the present invention, a refractivity of the second insulating film is different from that of the first insulating film, and a thickness of the second insulating film is not less than 30 nm, and not more than 80 nm.

In the solid-state imaging element according to the first or second embodiment of the present invention, the first insulating film is made of a silicon dioxide film, and the second insulating film is made of a silicon nitride film.

In the solid-state imaging element according to the first or second embodiment of the present invention, the first insulating film is made of a silicon dioxide film, and the second and third insulating films are each made of a silicon nitride film.

A method for fabricating a solid-state imaging element according to an embodiment of the present invention is a method for fabricating a solid-state imaging element including a photodiode formed in an upper portion of a semiconductor substrate to perform a photoelectric conversion, and a transistor formed in a region of the semiconductor substrate electrically isolated from the photodiode to process a signal photoelectrically converted by the photodiode, the method including the steps of: (a) forming an isolation region in the semiconductor substrate to electrically isolate a region where the photodiode is formed and a region where the transistor is formed; (b) forming the photodiode made of a diffusion layer in the upper portion of the semiconductor substrate in the region where the photodiode is formed, and forming the transistor in the semiconductor substrate in the region where the transistor is formed; (c) forming a first insulating film on the semiconductor substrate to cover the photodiode as well as the transistor; (d) forming a second insulating film on the first insulating film; (e) forming a first resist pattern entirely or partly covering a portion of the second insulating film located over the photodiode; (f) etching the first and second insulating films using the first resist pattern as a mask so as to leave the first and second insulating films over the photodiode, while forming sidewall spacers each composed of the first and second insulating films on side surfaces of a gate electrode composing the transistor; and (g) removing the first resist pattern.

The method for fabricating the solid-state imaging element according to the embodiment of the present invention further includes the steps of: (h) after the step (g), forming a second resist pattern having an opening for entirely or partly exposing the portion of the second insulating film located over the photodiode; and (i) etching the second insulating film using the second resist pattern as a mask so as to entirely or partly thin the portion of the second insulating film located over the photodiode.

The method for fabricating the solid-state imaging element according to the embodiment of the present invention further includes the steps of: (j) after the step (g), forming a third insulating film over an entire surface of the semiconductor substrate to cover the transistor; (k) forming a third resist pattern having an opening for entirely or partly exposing a portion of the third insulating film located over the photodiode; and (l) etching the third insulating film using the third resist pattern as a mask so as to entirely or partly remove the portion of the third insulating film located over the photodiode, and thereby entirely or partly expose the portion of the second insulating film located over the photodiode.

In this case, the step (l) includes the step of entirely or partly exposing the portion of the second insulating film located over the photodiode, and entirely or partly thinning the portion of the second insulating film located over the photodiode.

In the method for fabricating the solid-state imaging element according to the embodiment of the present invention, a refractivity of the second insulating film is different from that of the first insulating film, and a thickness of the second insulating film is not less than 30 nm, and not more than 80 nm.

In the method for fabricating the solid-state imaging element according to the embodiment of the present invention, the first insulating film is made of a silicon dioxide film, and the second insulating film is made of a silicon nitride film.

In the method for fabricating the solid-state imaging element according to the embodiment of the present invention, the first insulating film is made of a silicon dioxide film, and the second and third insulating films are each made of a silicon nitride film.

Thus, with the solid-state imaging element and the method for fabricating the same according to the present invention, even when a typical CMOS fabrication process is applied thereto, it is possible to suppress the occurrence of the degraded characteristics (a lower sensitivity, increased sensitivity variations, and an increased dark current) of the image sensor resulting from the surface roughening of the semiconductor substrate or the unexpected entrance of a metal impurity into the semiconductor substrate In addition, it is also possible to optimize the thickness of the antireflection film formed on the photodiode without undergoing restrictions related to the fabrication process.

BRIEF DESCRIPTION OF THE DRAWINGS

FIG. 1B is a cross-sectional view corresponding to the line Ib-Ib of FIG. 1A;

FIG. 4B is a cross-sectional view corresponding to the line IVb-IVb of FIG. 4A;

FIG. 6B is a cross-sectional view corresponding to the line VIb-VIb of FIG. 6A;

FIG. 8B is a cross-sectional view corresponding to the line VIIIb-VIIIb of FIG. 8A;

DETAILED DESCRIPTION OF THE INVENTION

Figure 1A:
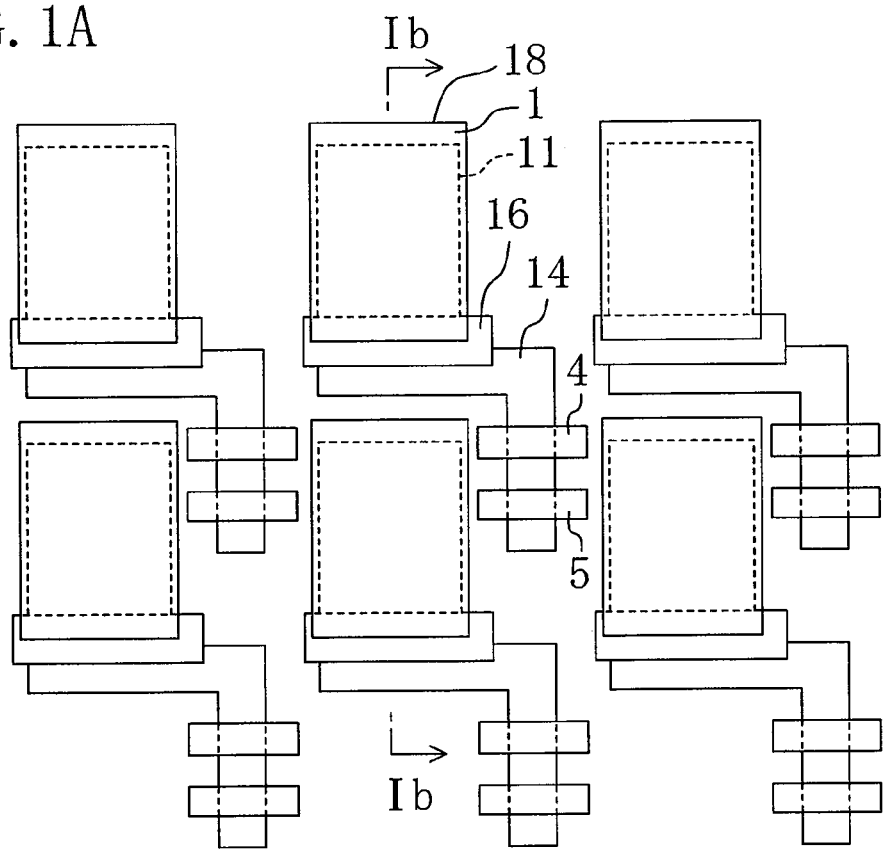
FIGS. 1A and 1B are views each showing a structure of a solid-state imaging element according to a first embodiment of the present invention, specifically showing a CMOS image sensor as an example, of which 1A is a plan view.

Referring now to the drawings, the individual embodiments of the present invention will be described herein below.

Embodiment 1

A solid-state imaging element and a method for fabricating the same according to the first embodiment of the present invention will be described.

First, a description will be given to a structure of the solid-state imaging element according to the first embodiment.

Figure 1B:
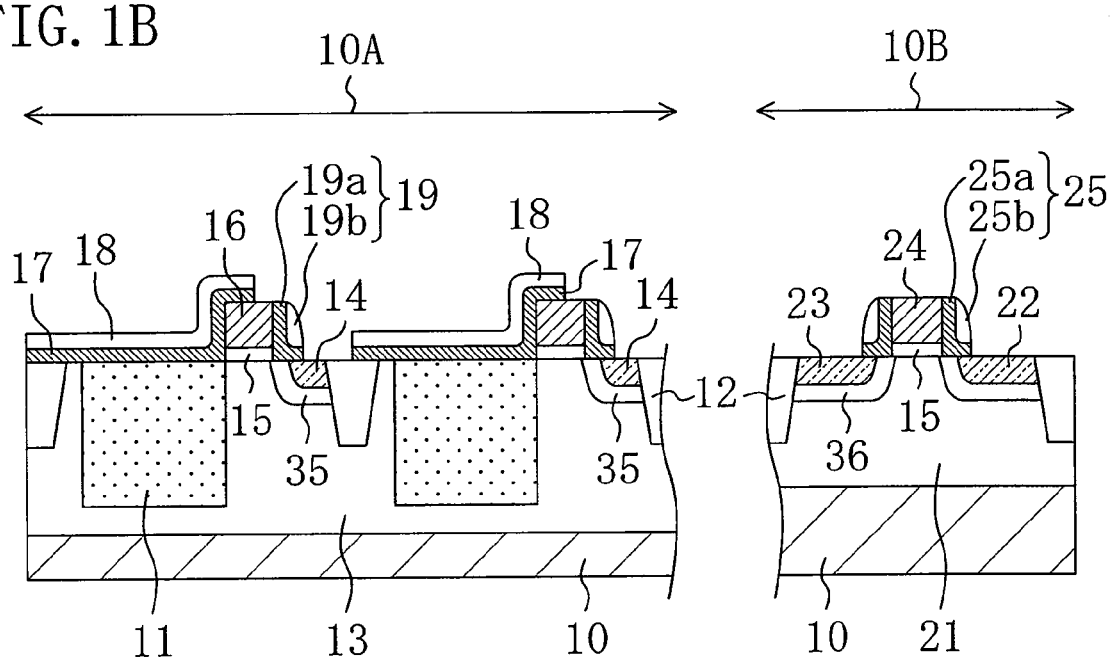

FIGS. 1A and 1B are views each showing the structure of the solid-state imaging element according to the first embodiment, specifically showing a CMOS image sensor as an example, of which 1A is a plan view, and FIG. 1B is a cross-sectional view corresponding to the line Ib-Ib of FIG. 1A.

In the plan view of FIG. 1A, the principal portion of the structure in which a plurality of pixels are arranged in an array is shown, and multilayer structures are formed. Each of the multilayer structures comprises an active region 1 including a photodiode 11 for performing a photoelectric conversion, a gate electrode 16 composing a transfer gate, a floating diffusion layer 14 made of an n-type diffusion layer, a gate electrode 4 composing a reset transistor, a gate electrode 5 composing an amplifier transistor, and a silicon dioxide film 17 (not shown) and a silicon nitride film 18 each located over the corresponding photodiode 11 in the active region 1.

In the cross-sectional view of FIG. 1B, a sensor region 10A and a transistor region 10B are shown over a silicon substrate 10. In the sensor region 10A, the photodiodes 11 each for performing a photoelectric conversion and composing a pixel portion are formed. In the transistor region 10B, a MOS transistor composing a CMOS logic circuit portion, which is not shown in FIG. 1A, is formed.

Specifically, as shown in FIG. 1B, an isolation region 12 is formed in the n-type silicon substrate 10 in the sensor region 10A, and a deep p-type well 13 composing the active region 1 is formed in an element formation region defined by the isolation region 12. In the upper portion of the p-type well 13, the photodiodes 11 each made of an n-type diffusion layer are formed. On the regions of the silicon substrate 10 adjacent to the photodiodes 11, the gate electrodes 16 of the transfer gates each made of a polysilicon film are formed via gate insulating films 15 each made of a silicon dioxide film.

On the side surface of each of the gate electrodes 16, a sidewall spacer 19 made of a silicon dioxide film 19a having an L-shaped cross-sectional configuration, and a silicon nitride film 19b formed on the inner surface of the silicon dioxide film 19a is formed. In the region of the silicon substrate 10 located laterally and outwardly under the gate electrode 16, a lightly doped impurity diffusion layer 35 is formed. In the lightly doped impurity diffusion layer 35, a floating diffusion layer 14 is formed. Over each of the photodiodes 11, a multilayer structure made of the silicon dioxide film 17 and the silicon nitride film 18, which is the same as the multilayer structure of the sidewall spacer 19 mentioned above, is formed to extend from a midpoint on the upper surface of the isolation region 12, and cover the side surface of the corresponding gate electrode 16 of the transfer gate which is closer to the photodiode 11, and also a part of the upper surface thereof.

On the other hand, as shown in FIG. 1B, the isolation region 12 is formed in the silicon substrate 10 in the transistor region 10B, and a deep p-type well 21 composing the active region 1 is formed in an element formation region defined by the isolation region 12. On the silicon substrate 10, a gate electrode 24 of a transistor made of a polysilicon film is formed via the gate insulating film 15 made of the silicon dioxide film. On the side surfaces of the gate electrode 24, sidewall spacers 25 each having a multilayer structure made of a silicon dioxide film 25a having an L-shaped cross-sectional configuration and a silicon nitride film 25b formed on the inner surface of the silicon dioxide film 25a, which is the same as the multilayer structure of the sidewall spacer 19, are formed. In the regions of the silicon substrate 10 located laterally and outwardly under the gate electrode 24, lightly doped impurity diffusion layers 36 are formed. In the regions of the silicon substrate 10 located laterally and outwardly under the sidewall spacers 25, the source/drain diffusion layers 22 and 23 of the transistor are formed.

Next, a description will be given to a method for fabricating the solid-state imaging element according to the first embodiment.

FIGS. 2A, 2B, 3A, and 3B are principal-portion cross-sectional views sequentially showing the process steps of the method for fabricating the solid-state imaging element according to the first embodiment, each in correspondence to the cross section of FIG. 1B. The isolation region 12, the p-type wells 13 and 21, and the photodiodes 11 are formed in the silicon substrate 10 by a known method so that a specific description thereof will be omitted for clear illustration of the method for fabricating the solid-state imaging element.

Figure 2A:
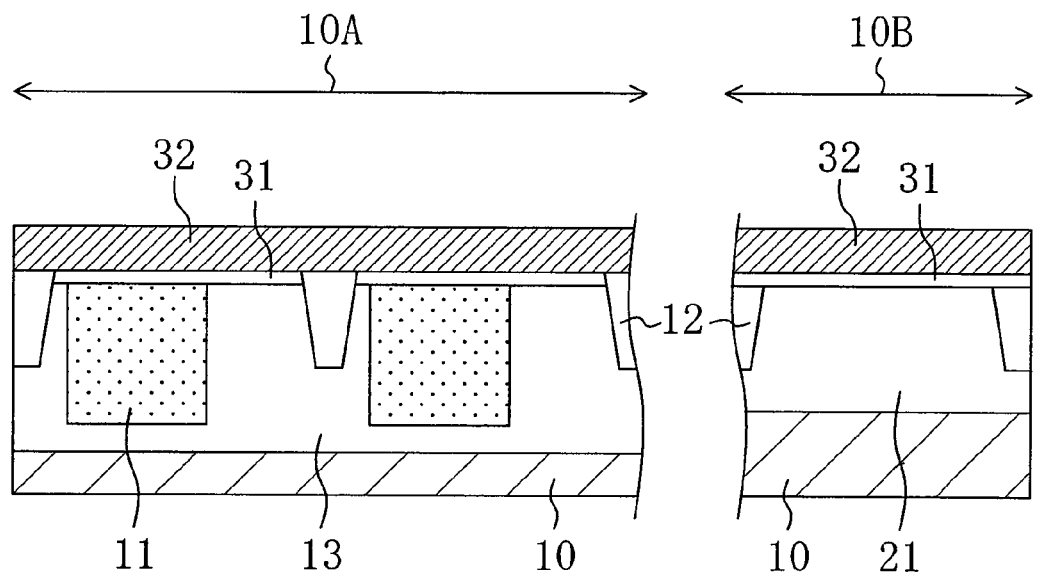
FIGS. 2A and 2B are principal-portion cross-sectional views sequentially showing the process steps of a method for fabricating the solid-state imaging element according to the first embodiment, each in correspondence to the cross section of FIG. 1B.

First, as shown in FIG. 2A, the isolation region 12 is formed in the n-type silicon substrate 10 in each of the sensor region 10A and the transistor region 10B. In the element formation regions defined by the isolation region 12, the deep p-type wells 13 and 21 composing each of the active regions 1 are formed. In the sensor region 10A, the photodiodes 11 each made of the n-type diffusion layer are formed in the upper portions of the p-type well 13. In this state, in each of the sensor region 10A and the transistor region 10B, a silicon dioxide film 31 having a thickness of about 10 nm is formed by thermal oxidation on the silicon substrate 10 in which the photodiodes 11 are formed. Then, a polysilicon film 32 having a thickness of about 200 nm is deposited by a reduced pressure CVD method over the silicon dioxide film 31 and the isolation region 12.

Figure 2B:
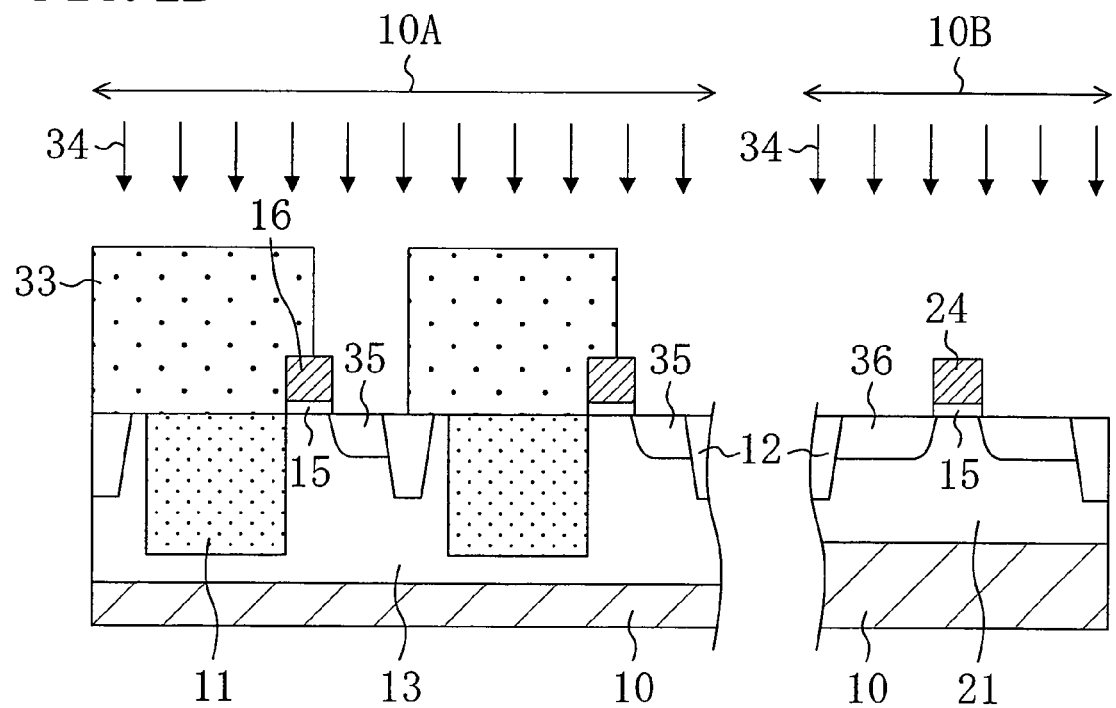

Next, as shown in FIG. 2B, the polysilicon film 32 and the silicon dioxide film 31 are patterned in each of the sensor region 10A and the transistor region 10B to form the gate electrodes 16 of the transfer gates each made of the polysilicon film 32 via the gate insulating films 15 each made of the silicon dioxide film 31 in the sensor region 10A, and form the gate electrode 24 made of the polysilicon film 32 via the gate insulating film 15 in the transistor region 10B. Subsequently, in the sensor region 10A, a resist pattern 33 is formed to extend from a midpoint on the upper surface of the isolation region 12, and cover the upper surface of each of the photodiodes 11, the side surface of each of the gate electrodes 16 of the transfer gates which is closer to the photodiode 11, and also a part of the upper surface thereof. By performing phosphorus ion implantation 34 using the resist pattern 33 as a mask, the lightly doped impurity diffusion layer 35 is formed in the area of the p-type well 13 located laterally and outwardly under the gate electrode 16 in the sensor region 10A, while the lightly doped impurity diffusion layer 36 is formed in the area of the silicon substrate 10 located laterally and outwardly under the gate electrode 24 of the transistor in the transistor region 10B. The ion implantation 34 using phosphorus ions may be performed appropriately toward the silicon substrate 10 with an acceleration energy of, e.g., 45 eV, and at a doze of, e.g., about $5\times10^{12}$ cm$^{-2}$.

Figure 3A:
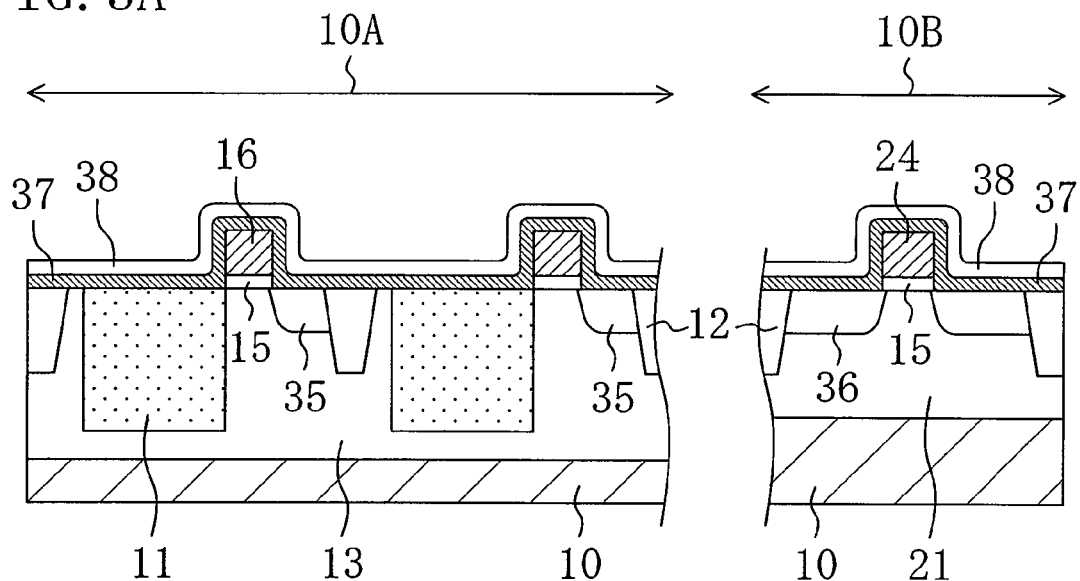
FIGS. 3A and 3B are principal-portion cross-sectional views sequentially showing the process steps of the method for fabricating the solid-state imaging element according to the first embodiment, each in correspondence to the cross section of FIG. 1B.

Next, as shown in FIG. 3A, a silicon dioxide film 37 having a thickness of about 20 nm is deposited by a reduced pressure CVD method over the entire surface of the silicon substrate 10 in each of the sensor region 10A and the transistor region 10B. Then, a silicon nitride film 38 having a thickness of about 80 nm is deposited on the silicon dioxide film 37 by a reduced pressure CVD method. At this time, the silicon nitride film 38 is deposited only by a thickness sufficient to ensure the widths of the sidewall spacers necessary for optimizing the electric characteristics of the transistor. As described above, the silicon nitride film 38 is formed optimally by a reduced pressure CVD method to have a compact and stable film quality since it is necessary to suppress the influence of a film reduction or the deterioration of the film quality even when cleaning using a chemical solution is performed additionally in a subsequent process step. Because the silicon nitride film 38 is left on each of the photodiodes 11, as will be described later, it is required to assure the transmittance of incident light, i.e., transparency for the silicon nitride film 38.

Figure 3B:
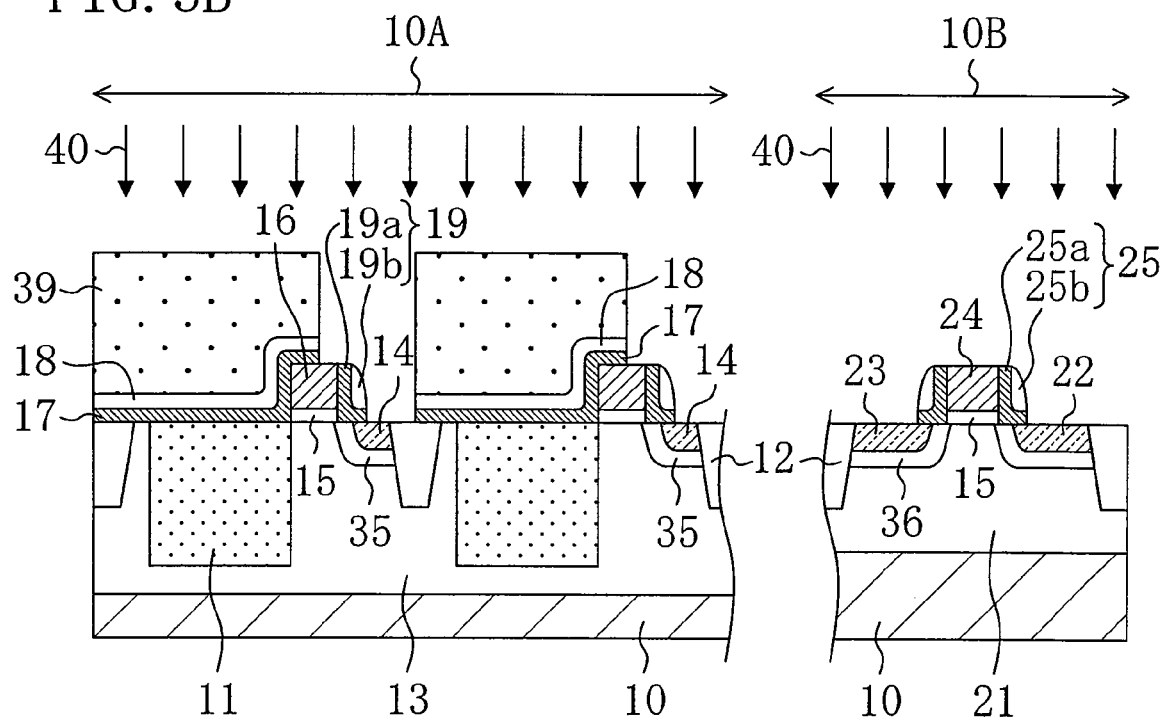

Next, as shown in FIG. 3B, a resist pattern 39 is formed in the sensor region 10A to extend from a midpoint on the upper surface of the isolation region 12 and cover the upper surface of each of the photodiodes 11, the side surface of each of the gate electrodes 16 of the transfer gates which is closer to the photodiode 11, and also a part of the upper surface thereof, while exposing a part of the upper surface of each of the transfer gate electrodes 16, the upper surface of each of the sidewall spacers 19 described later, and a part of the upper surface of the isolation region 12. Anisotropic dry etching is performed using the resist pattern 39 as a mask to remove the silicon nitride film 38 and the silicon dioxide film 37 in this order. In this manner, the sidewall spacer 19 made of the multilayer structure of the silicon dioxide film 19a having the L-shaped cross-sectional configuration and the silicon nitride film 19b formed on the inner surface of the silicon dioxide film 19a is formed on the side surface of each of the gate electrodes 16 of the transfer gates which is more distant from the corresponding photodiode 11 in the sensor region 10A, while the sidewall spacers 25 each made of the multilayer structure of the silicon dioxide film 25a having the L-shaped cross-sectional configuration and the silicon nitride film 25b formed on the inner surface of the silicon dioxide film 25a are formed on the both side surfaces of the gate electrode 24 of the transistor in the transistor region 10B.

Subsequently, arsenic ion implantation 40 is performed using the resist pattern 39, the gate electrodes 16 of the transfer gates, and the sidewall spacers 19 as a mask in the sensor region 10A, while using the gate electrode 24 of the transistor and the sidewall spacers 25 as a mask in the transistor region 10B, to form the floating diffusion layers 14 in the areas of the p-type well 13 located laterally and outwardly under the gate electrodes 16 in the sensor region 10A, and form the source/drain diffusion layer 22 and 23 in the areas of the p-type well region 21 located laterally and outwardly under the sidewall spacers 25 in the transistor region 10B. The ion implantation of arsenic ions may be performed appropriately toward the silicon substrate 10 with an acceleration energy of, e.g., 50 eV, and at a doze of, e.g., about $2\times10^{15}$ cm$^{-2}$. Thereafter, the resist pattern 39 is removed, whereby the solid-state imaging element having the structure shown in FIG. 1B according to the present embodiment is formed.

Thus, in the solid-state imaging element and the method for fabricating the same according to the first embodiment, even when a typical CMO fabrication process is applied thereto, the silicon dioxide film 37 and the silicon nitride film 38 which are deposited on each of the photodiodes 11 remain without being etched during the formation of the sidewall spacers of the transistors. As a result, there is no occurrence of the surface roughening of the semiconductor substrate or the unexpected entrance of a metal impurity into the semiconductor substrate at the surface of each of the photodiodes 11 during the dry etching for forming the sidewall spacers. Therefore, it is possible to suppress the occurrence of the degraded characteristics (a lower sensitivity, increased sensitivity variations, and an increased dark current) of the image sensor resulting from the surface roughening of the semiconductor substrate or the unexpected entrance of a metal impurity into the semiconductor substrate.

As shown in FIG. 1A, the present embodiment has described, by way of example, the case where the solid-state imaging element has a configuration in which one pixel composes one cell. However, the same effects as described above are obtainable even in the case where the solid-state imaging element has a configuration in which plural or multiple pixels compose one cell to share the transfer gate, the floating diffusion layer, the reset transistor, and the amplifier transistor, as will be described later in the fourth embodiment of the present invention.

Embodiment 2

A solid-state imaging element and a method for fabricating the same according to the second embodiment of the present invention will be described.

First, a description will be given to a structure of the solid-state imaging element according to the second embodiment.

Figure 4A:
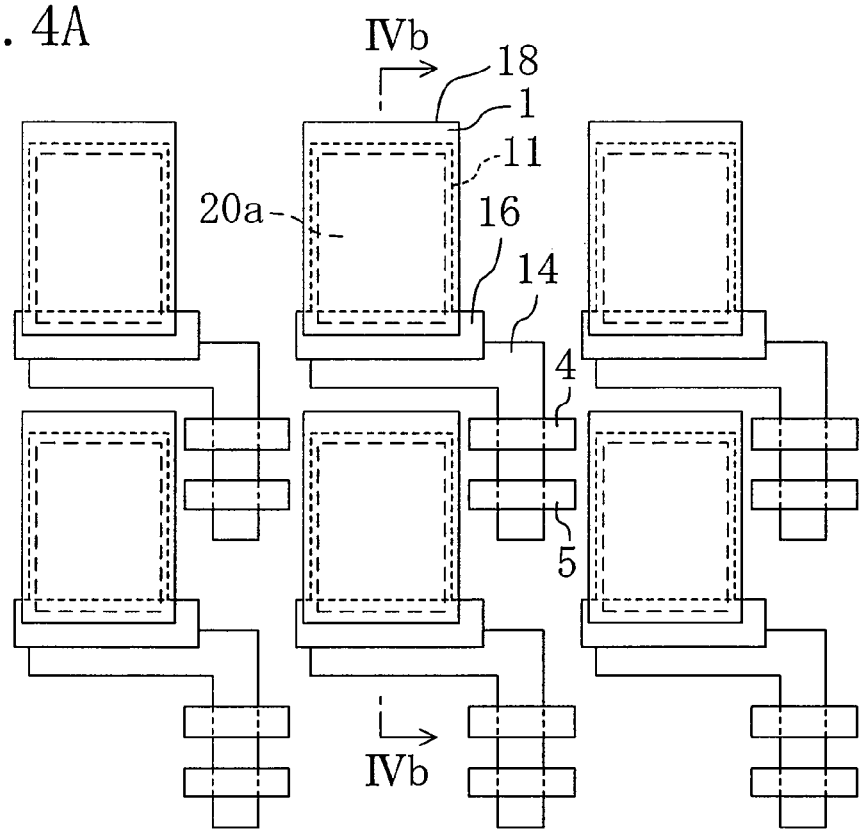
FIGS. 4A and 4B are views each showing a structure of a solid-state imaging element according to a second embodiment of the present invention, specifically showing a CMOS image sensor as an example, of which 4A is a plan view.
Figure 4B:
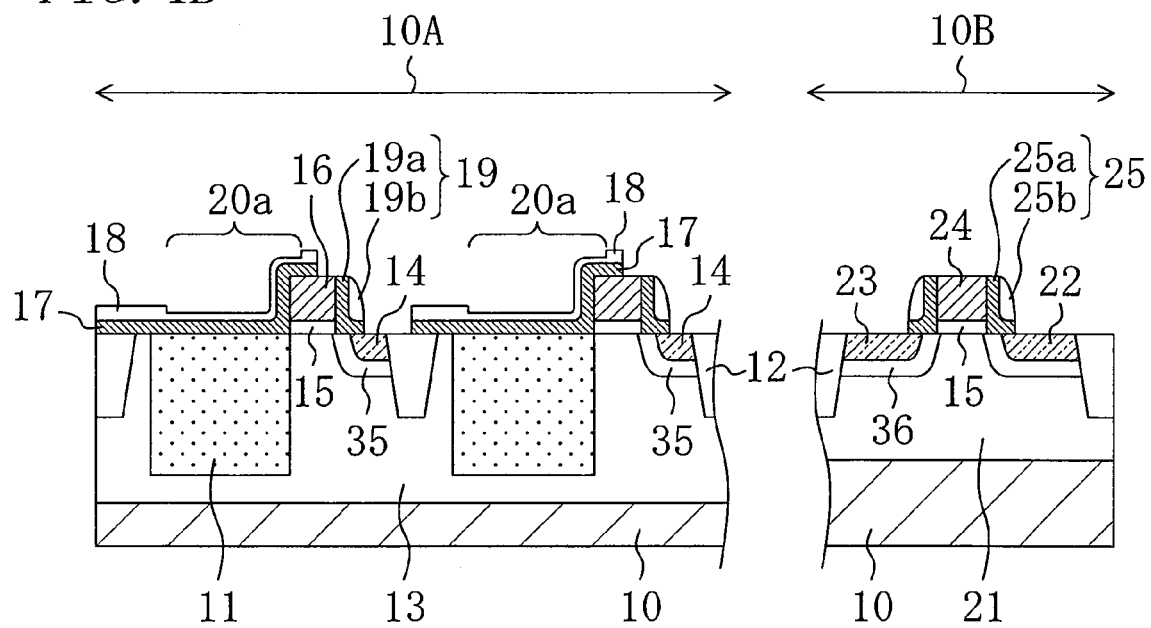

FIGS. 4A and 4B are views each showing a structure of the solid-state imaging element according to the second embodiment, specifically showing a CMOS image sensor as an example, of which 4A is a plan view, and FIG. 4B is a cross-sectional view corresponding to the line IVb-IVb of FIG. 4A.

The structure of the solid-state imaging element according to the present embodiment shown in FIGS. 4A and 4B is the same as that of the foregoing solid-state imaging element according to the first embodiment shown in FIGS. 1A and 1B, except that each of the silicon nitride films 18 has a different structure.

That is, as shown in FIGS. 4A and 4B, the structure of the solid-state imaging element according to the present embodiment is characterized in that each of the silicon nitride films 18 has a thinner region 20a smaller in thickness than the end portion of the silicon nitride film 18 located over the isolation region 12 or over the upper surface of the corresponding gate electrode 16 of the transfer gate. The thinner region 20a is located over at least a part of the upper surface of the corresponding photodiode 11, over the side surface of the corresponding gate electrode 16 of the transfer gate which is closer to the photodiode 11, and also over a part of the upper surface thereof. The structure of the solid-state imaging element is otherwise the same as in the first embodiment described above, so that a description thereof will not be repeated.

Next, a description will be given to a method for fabricating the solid-state imaging element according to the second embodiment.

Figure 5:
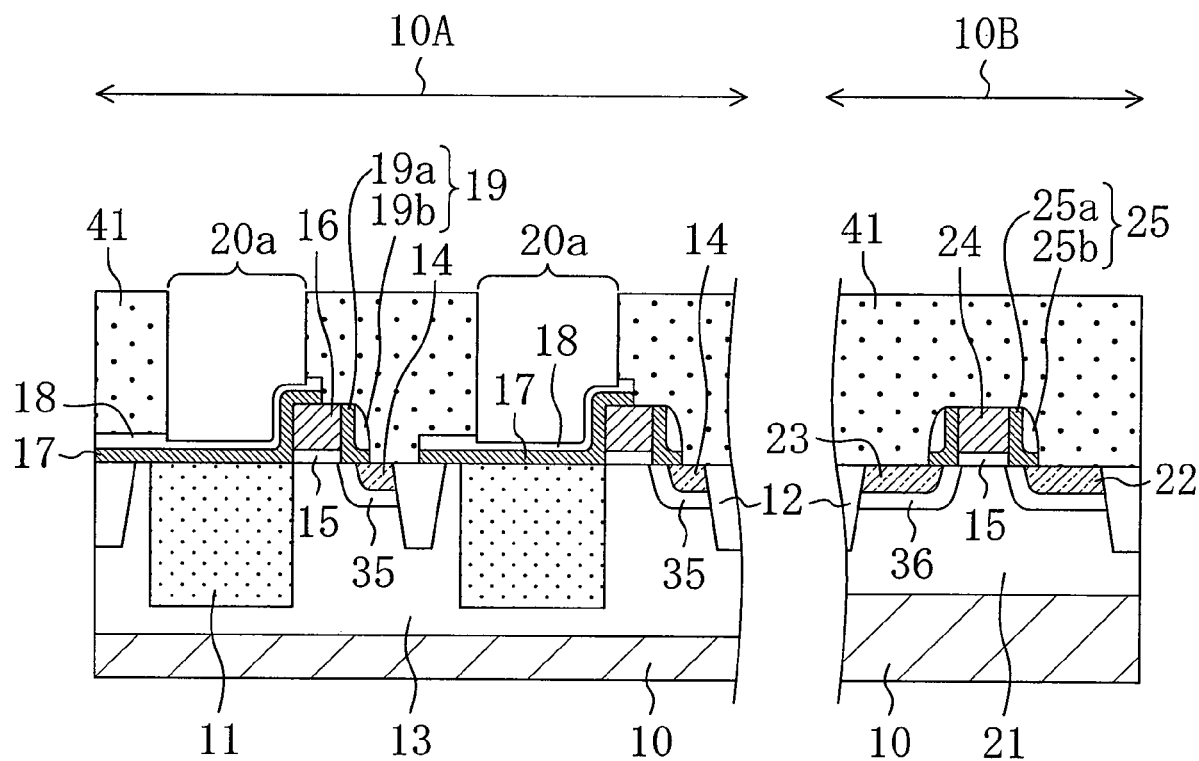
FIG. 5 is a cross-sectional view showing the process step of a method for fabricating the solid-state imaging element according to the second embodiment in correspondence to the line IVb-IVb of FIG. 4A.

FIG. 5 is a cross-sectional view showing the process step of the method for fabricating the solid-state imaging element according to the second embodiment in correspondence to the line IVb-IVb of FIG. 4A. The method for fabricating the solid-state imaging element according to the present embodiment has a characteristic process step resulting from the characteristic structure of the solid-state imaging element described above with reference to FIGS. 4A and 4B, and the other process steps are the same as those of the method for fabricating the solid-state imaging element according to the first embodiment described above. Therefore, the following description will be given primarily to the characteristic portion.

In the present embodiment also, the above-mentioned structure shown in FIG. 1B is obtained in the same manner as in the description of the process steps shown in FIGS. 2A, 2B, 3A, and 3B in the first embodiment described above.

Next, as shown in FIG. 5, a resist pattern 41 is formed to expose a portion of each of the silicon nitride films 18 located over at least a part of the upper surface of the corresponding photodiode 11, over the side surface of the corresponding gate electrode 16 of the transfer gate which is closer to the photodiode 11, and also over a part of the upper surface thereof, and cover a part of the upper surface of each of the gate electrodes 16 of the transfer gates, the surface of each of the sidewall spacers 19, and the portion of each of the silicon nitride films 18 adjacent to the end portion thereof located over the isolation region 12 in the sensor region 10A, while it is formed to cover the entire surface of the silicon substrate 10 in the transistor region 10B. Subsequently, by dry etching using the resist pattern 41 as a mask, the thinner region 20a having a reduced thickness of about 40 mm is formed in each of the silicon nitride films 18 to be located over at least a part of the upper surface of the corresponding photodiode 11, over the side surface of the corresponding gate electrode 16 of the transfer gate which is closer to the photodiode 11, and also over a part of the upper surface thereof in the sensor region 10A. The thickness of the thinner region of each of the silicon nitride films 18 is preferably in the range of not less than 30 nm and not more than 80 nm which provides an optimum film thickness for preventing reflection from the silicon substrate 10, though the thickness of the thinner portion is also dependent on the thickness of each of the underlying silicon dioxide films 17.

Thus, the solid-state imaging element and the method for fabricating the same according to the second embodiment can achieve the effect of suppressing the occurrence of the degraded characteristics (a lower sensitivity, increased sensitivity variations, and an increased dark current) of the image sensor, similarly to those according to the first embodiment described above. In addition, since it is possible to freely adjust the thickness of each of the silicon nitride films 38 over the corresponding photodiode 11 such that the silicon nitride film 38 is thinned by etching over at least a part of the photodiode 11, the thickness required of the silicon nitride film 25b composing each of the sidewall spacers 25 and the optimum thickness required of the silicon nitride film 18 functioning as the antireflection film can be controlled independently of each other in a CMOS fabrication process. This allows the formation of the antireflection film having a sufficient antireflection effect on each of the photodiodes 11. Accordingly, it becomes easy to maintain or improve the sensitivity even when a pixel size is further reduced.

Moreover, since the thickness of each of the silicon nitride films 38 over the photodiodes 11 can be adjusted independently as described above, when an insulating film made of a material having a film stress larger than that of silicon, such as, e.g., a silicon nitride film, is deposited as the insulating film over each of the photodiodes 11, it is possible to keep the amount of the film thickness reduction to a minimum required level, and thereby suppress a crystal defect in the silicon substrate 10 caused by the film stress. This also makes it possible to suppress the degraded characteristics (an increased dark current and a defect in an image) of the image sensor resulting from a crystal defect present in the portion of the silicon substrate 10 located in the region where the photodiode 11 is formed.

As shown in FIG. 4A, the present embodiment has described, by way of example, the case where the solid-state imaging element has a configuration in which one pixel composes one cell. However, the same effects as described above are obtainable even in the case where the solid-state imaging element has a configuration in which plural or multiple pixels compose one cell to share the transfer gate, the floating diffusion layer, the reset transistor, and the amplifier transistor, as will be described later in the fourth embodiment of the present invention.

Embodiment 3

A solid-state imaging element and a method for fabricating the same according to the third embodiment of the present invention will be described.

First, a description will be given to a structure of the solid-state imaging element according to the third embodiment.

Figure 6A:
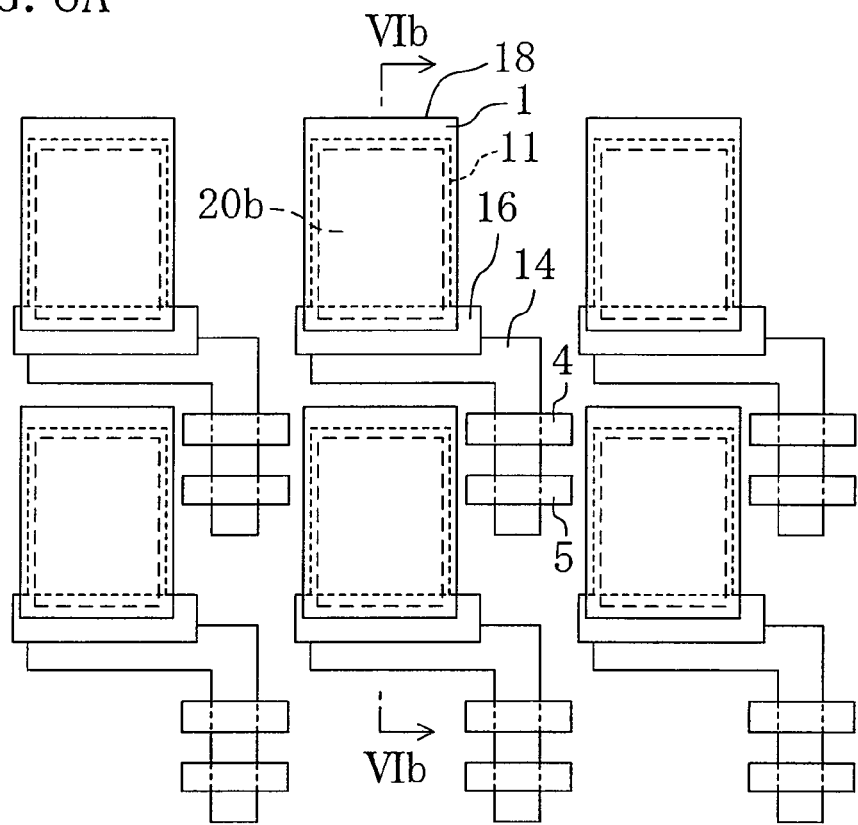
FIGS. 6A and 6B are views each showing a structure of a solid-state imaging element according to a third embodiment of the present invention, specifically showing a CMOS image sensor as an example, of which 6A is a plan view.
Figure 6B:
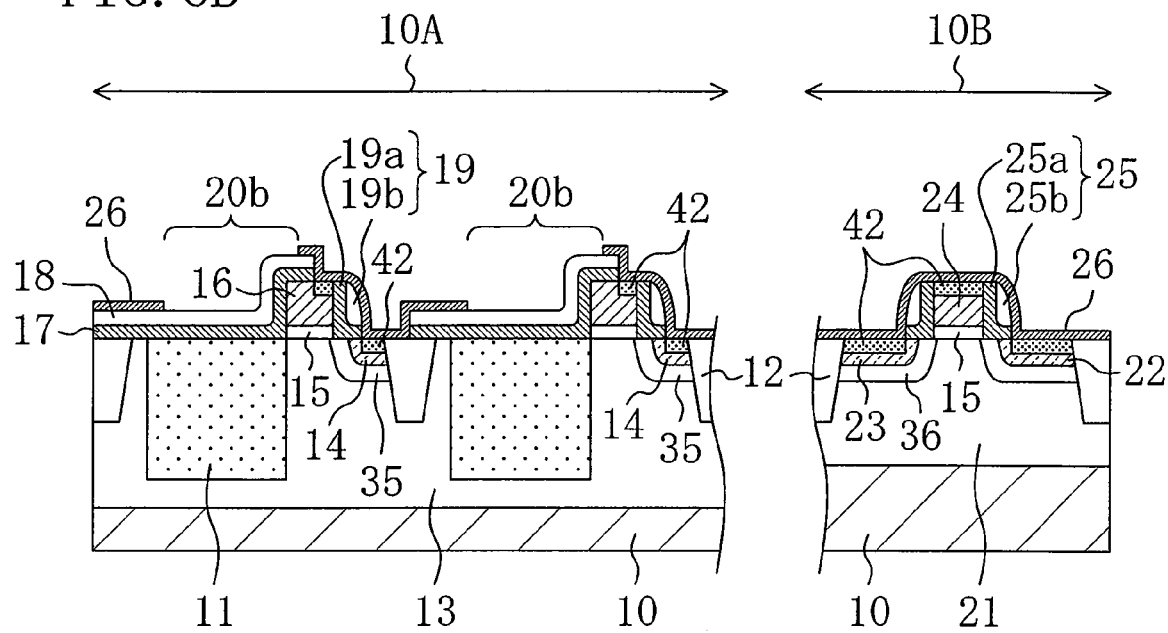

FIGS. 6A and 6B are views each showing a structure of the solid-state imaging element according to the third embodiment, specifically showing a CMOS image sensor as an example, of which 6A is a plan view, and FIG. 6B is a cross-sectional view corresponding to the line VIb-VIb of FIG. 6A.

The structure of the solid-state imaging element according to the present embodiment shown in FIGS. 6A and 6B is the same as that of the foregoing solid-state imaging element according to the first embodiment shown in FIGS. 1A and 1B, except that a liner film 26 (not shown in FIG. 6A) made of a silicon nitride film formed over the entire surface of the silicon substrate 10 is further provided.

That is, as shown in FIGS. 6A and 6B, in the structure of the solid-state imaging element according to the present embodiment, the liner film 26 made of the silicon nitride film 26 is formed over the entire surface of the silicon substrate 10, and the liner film 26 has openings each for exposing the portion of the corresponding silicon nitride film 18 located over at least a part of the upper surface of the corresponding photodiode 11, over the side surface of the corresponding gate electrode 16 of the transfer gate which is closer to the photodiode 11, and also over a part of the upper surface thereof. The structure of the solid-state imaging element is otherwise the same as in the first embodiment described above, so that a description thereof will not be repeated.

Next, a description will be given to a method for fabricating the solid-state imaging element according to the third embodiment.

Figure 7A:
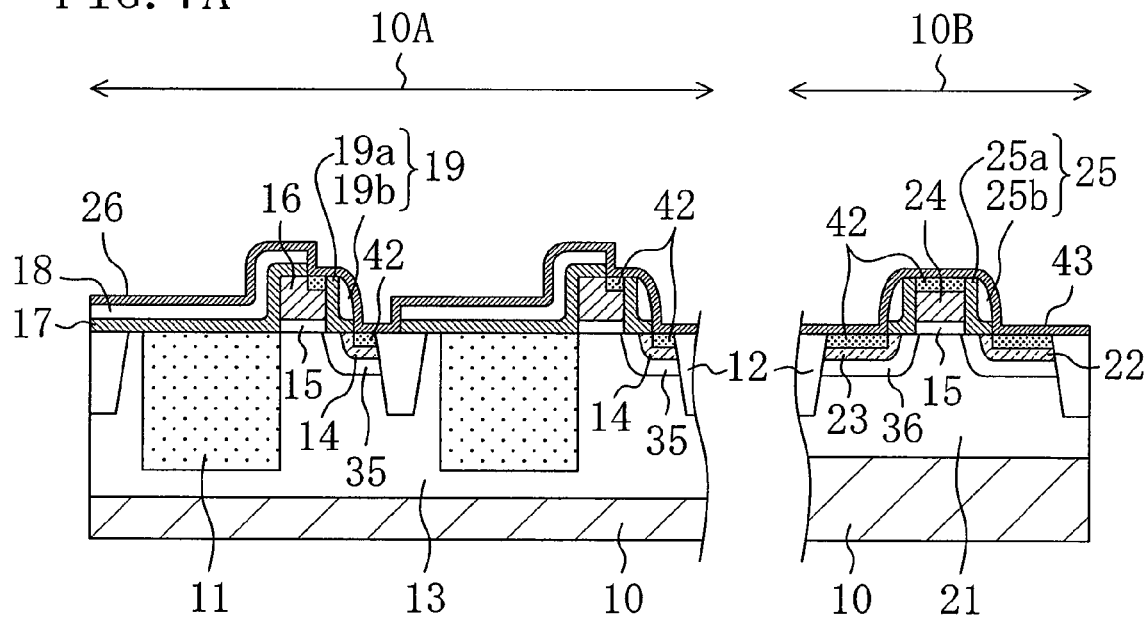
FIGS. 7A and 7B are cross-sectional views showing the process steps of a method for fabricating the solid-state imaging element according to the third embodiment, each in correspondence to the line VIb-VIb of FIG. 6A.
Figure 7B:
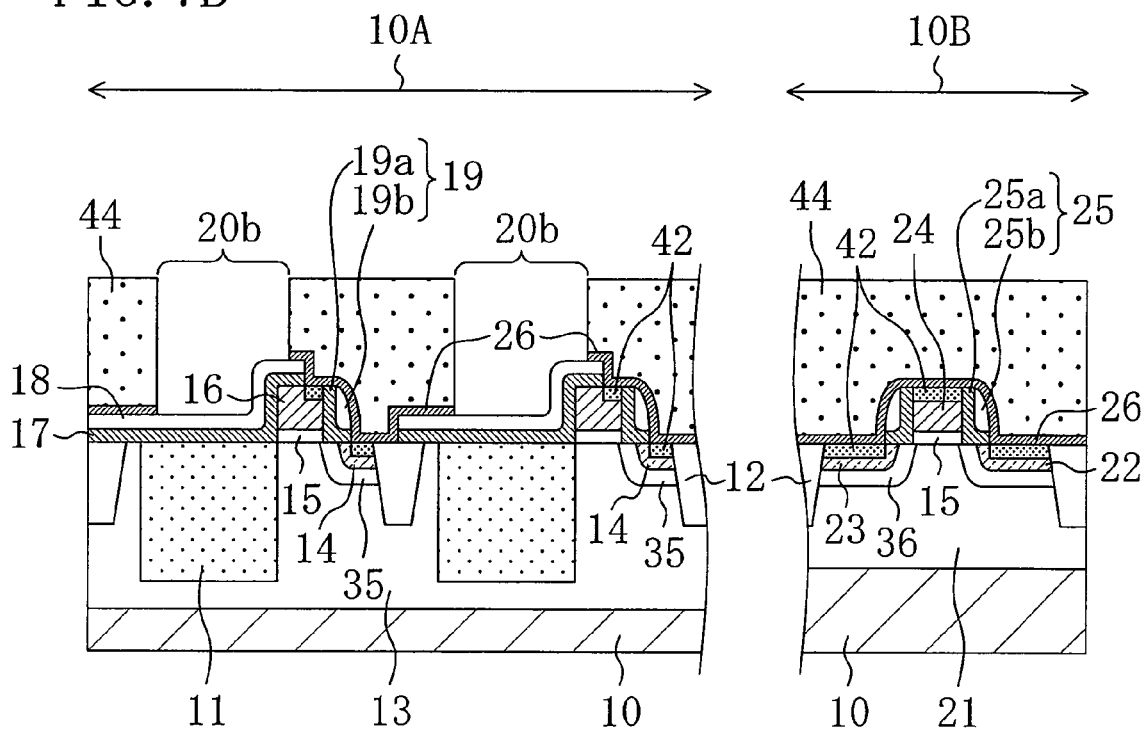

FIGS. 7A and 7B are cross-sectional views showing the process steps of the method for fabricating the solid-state imaging element according to the third embodiment, each in correspondence to the line VIb-VIb of FIG. 6A. The method for fabricating the solid-state imaging element according to the present embodiment has a characteristic process step resulting from the characteristic structure of the solid-state imaging element described above with reference to FIGS. 6A and 6B, and the other process steps are the same as those of the method for fabricating the solid-state imaging element according to the first embodiment described above. Therefore, the following description will be given primarily to the characteristic portion.

In the present embodiment also, the above-mentioned structure shown in FIG. 1B is obtained in the same manner as in the description of the process steps shown in FIGS. 2A, 2B, 3A, and 3B in the first embodiment described above.

Next, as shown in FIG. 7A, cobalt is deposited over the entire surface of the silicon substrate 10. Then, by a silicidation method, salicide layers 42 each made of cobalt salicide are formed in respective parts of the gate electrodes 16 of the transfer gates, and in respective parts of the upper surfaces of the floating diffusion layers 14 in the sensor region 10A, while they are formed in the respective upper surfaces of the gate electrode 24 the source diffusion layer 22, and the drain diffusion layer 23 in the transistor region 10B. Subsequently, the liner layer 26 made of the silicon nitride film having a thickness of about 30 nm is formed over the entire surface of the silicon substrate 10 by a plasma CVD method. At this time, the silicon nitride film composing the liner film 26 is formed only by a thickness of about 30 nm required of an etching stopper film when dry etching is performed during the formation of a contact hole reaching the gate electrode 24, the source diffusion layer 22, and the drain diffusion layer 23, though not shown in the description of the present embodiment. To suppress the degeneration (abnormal growth of the salicide film or an increase in the resistance of the salicide film) of the salicide layer 42 made of cobalt silicide and formed under the silicon nitride film, the silicon nitride film composing the liner film 26 needs to be deposited at a temperature of not more than 600° C. The silicon nitride film is formed optimally by a plasma CVD which allows the formation of the silicon nitride film at a relatively low temperature.

Next, as shown in FIG. 7B, a resist pattern 44 having openings corresponding to regions 20b is formed on the liner film 26. Then, dry etching is performed using the resist pattern 44. As a result, the openings each for exposing at least a part of the upper surface of the corresponding photodiode 11, the side surface of the corresponding gate electrode 16 of the transfer gate which is closer to the photodiode 11, and also a part of the upper surface thereof in the corresponding region 20b are formed in the liner film 26. Thereafter, by removing the resist pattern 44, the above-mentioned structure shown in FIG. 6B is obtained. In the process step of forming the openings in the liner film 26 in the regions 20b, the openings may also be formed such that a part of the liner film 26 remains in an amount sufficient to exert the antireflection function in cooperation with the underlying silicon nitride film 18 without exposing the silicon nitride film 18. In this case, the thickness of the liner film 26 to be left is preferably in the range of not less than 30 nm and not more than 80 nm, similarly to the silicon nitride film 18 in the second embodiment.

Thus, the solid-state imaging element and the method for fabricating the same according to the third embodiment can achieve the effect of suppressing the occurrence of the degraded characteristics (a lower sensitivity, increased sensitivity variations, and an increased dark current) of the image sensor, similarly to those according to the first embodiment described above. In addition, when the salicide layers 42 are formed in the surface of the silicon substrate 10, the salicide layers 42 are not formed over the surfaces of the photodiodes 11, since the silicon nitride films 18 are present over the respective photodiodes 11. When the salicide layers are formed on the photodiodes, it may be considered that a leakage current may occur to cause the problems of an increased dark current or sensitivity variations, since not only the salicide layers hinder the transmission of incident light and degrade the sensitivity, but also cobalt atoms that are left without being silicidized induce a crystal current in the silicon substrate in which the photodiodes are formed. However, the present invention can prevent such a situation.

Moreover, since it is possible to selectively remove only the liner film 26 made of the silicon nitride film formed on each of the photodiodes 11, when light is incident on the solid-state imaging element, the light can be efficiently made incident only on the photodiode 11. On the other hand, the silicon nitride films 18 and the liner film 26 made of the silicon nitride film are formed in stacked relation in the region other than the regions where the photodiodes 11 are present so that the other region is less transmissive to the incident light. As a result, it becomes possible to suppress not only the phenomenon of color mixing caused by, e.g., the incidence of light on the isolation region 12 present between the adjacent photodiodes 11 (leakage of incident light to the adjacent photodiodes 11), but also a circuit misoperation caused by the incidence of intensive light on the peripheral CMOS circuit portion. To further suppress the transmission of light incident on the region other than the regions where the photodiodes 11 are present, a material lower in light transmission than a silicon nitride film and also usable for an etching stopper film may also be used as a material for composing the liner layer 26. For example, the liner layer 26 made of metal oxide such as alumina ($Al_2O_3$), or a hydrogenated silicon nitride compound ($SiO_xN_yH_z$) may be formed appropriately.

Further, since the thickness of the liner film 26 made of the silicon nitride film over each of the photodiodes 11 can be adjusted independently as described above, when an insulating film made of a material larger in film stress than silicon such as, e.g., a silicon nitride film is deposited as the insulating film over each of the photodiodes 11, it is possible to keep the amount of the film thickness reduction to a minimum required level, and thereby suppress a crystal defect in the silicon substrate 10 caused by the film stress. This also makes it possible to suppress the degraded characteristics (an increased dark current or a defect in an image) of the image sensor caused by a crystal defect present in the portion of the silicon substrate 10 located in the region where the photodiode 11 is formed.

Figure 10:
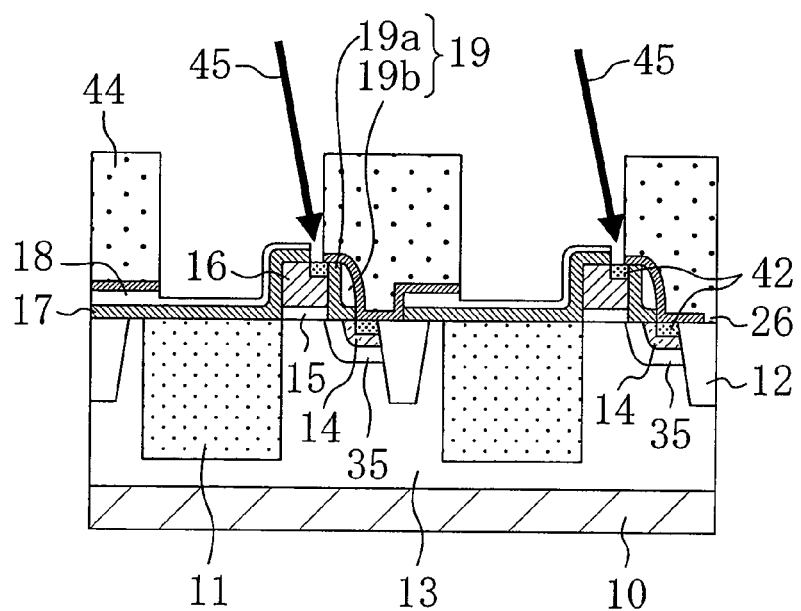
FIG. 10 is a cross-sectional view showing, as a comparative example, a structure having an exposed salicide layer in the method for fabricating the solid-state imaging element according to the third embodiment.
Figure 11A:
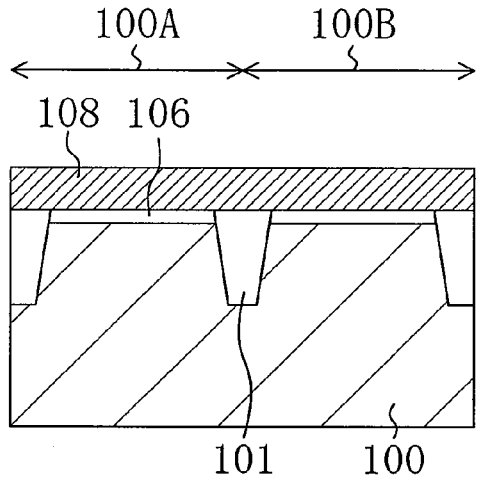
FIGS. 11A to 11E are principal-portion cross-sectional views sequentially showing the process steps of a conventional method for fabricating a solid-state imaging element.
Figure 11D:
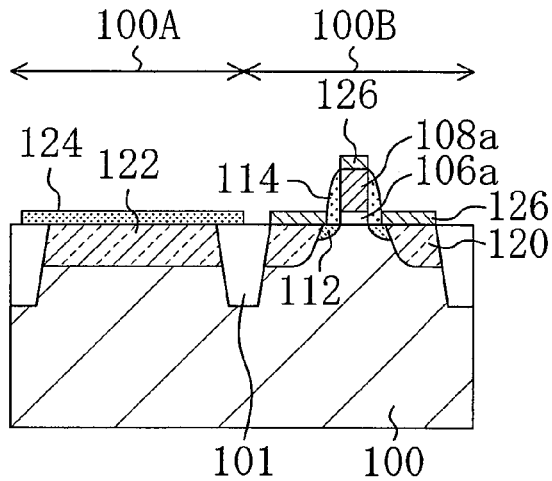
Figure 11B:
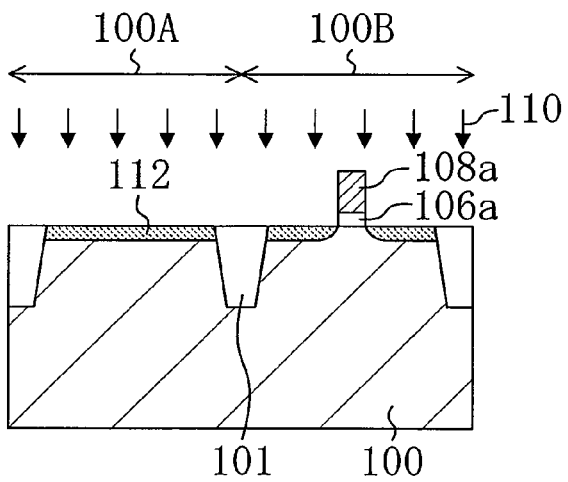
Figure 11E:
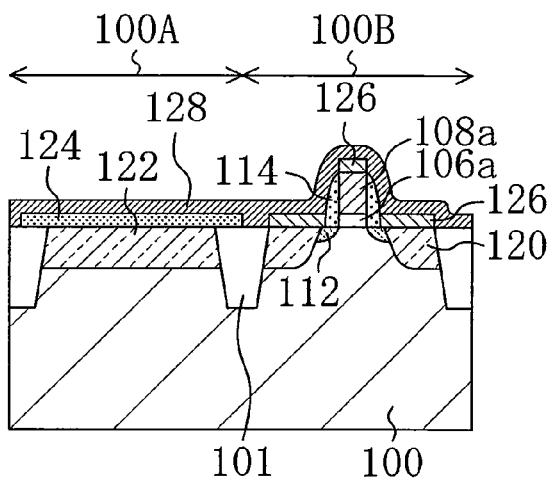
Figure 11C:
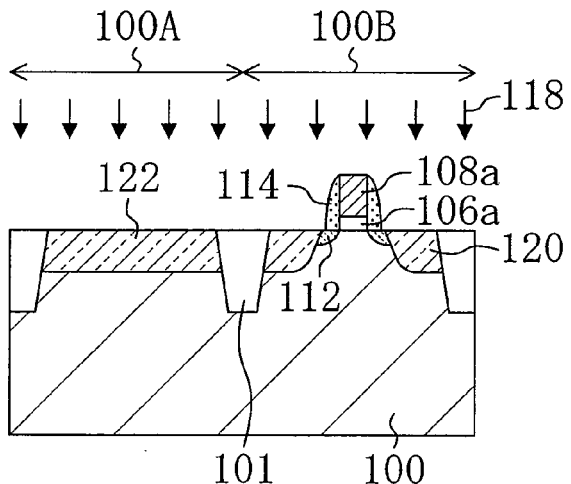

Furthermore, in the method for fabricating the solid-state imaging element according to the present embodiment, the salicide layers 42, each made of cobalt silicide, are prevented from being exposed during the etching using the resist pattern 44 by forming the resist pattern 44 in the process step shown in FIG. 7B such that the position where the resist pattern 39 used in the process step of FIG. 3B is formed and the position where the resist pattern 44 shown in FIG. 7B is formed to overlap each other over each of the gate electrodes 16 of the transfer gates. This can also achieve the effect of preventing metal contamination caused by cobalt not only in the solid-state imaging element according to the present embodiment, but also in fabrication equipment during etching and subsequent cleaning. That is, when the resist pattern 44 is formed so as not to overlap the position where the resist pattern 39 used in the process step of FIG. 3B is formed over each of the gate electrodes 16 of the transfer gates as shown in FIG. 10, regions 45 where the salicide layers 42, each made of cobalt silicide, in the respective gate electrodes 16 of the transfer gates are exposed are formed during the etching using the resist pattern 44, so that metal contamination is caused by cobalt not only in the solid-state imaging element described above, but also in the fabrication equipment. However, the present invention can prevent such a situation.

Although the present embodiment has described the case where the salicide layers 42 are formed in each of the sensor region 10A and the transistor region 10B, the effects other than those related to the salicide layers mentioned above are also similarly obtainable even in a structure in which the salicide layers are provided only in the transistor region 10B composing the peripheral CMOS circuit portion, or in a structure where the salicide layers are not provided in either of the sensor region 10A and the transistor region 10B.

As shown in FIG. 6A, the present embodiment has described, by way of example, the case where the solid-state imaging element has a configuration in which one pixel composes one cell. However, the same effects as described above are obtainable even in the case where the solid-state imaging element has a configuration in which plural or multiple pixels compose one cell to share the transfer gate, the floating diffusion layer, the reset transistor, and the amplifier transistor, as will be described later in the fourth embodiment of the present invention.

Embodiment 4

A solid-state imaging element and a method for fabricating the same according to the fourth embodiment of the present invention will be described.

First, a description will be given to a structure of the solid-state imaging element according to the fourth embodiment.

Figure 8A:
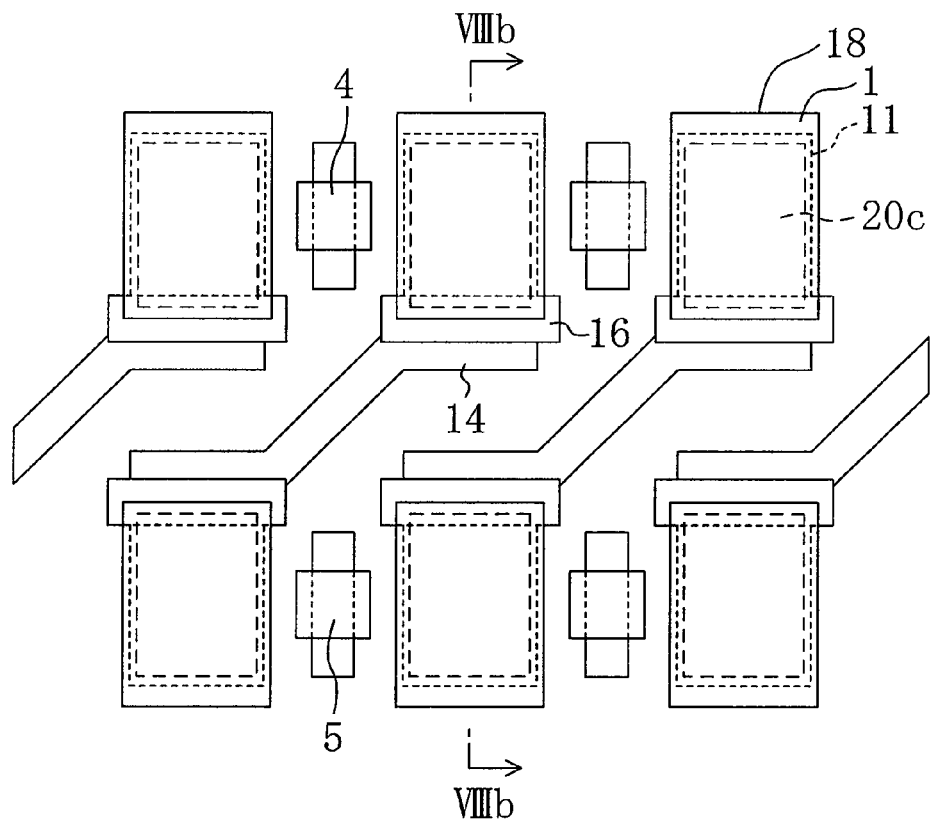
FIGS. 8A and 8B are views each showing a structure of a solid-state imaging element according to a fourth embodiment of the present invention, specifically showing a CMOS image sensor as an example, of which 8A is a plan view.
Figure 8B:
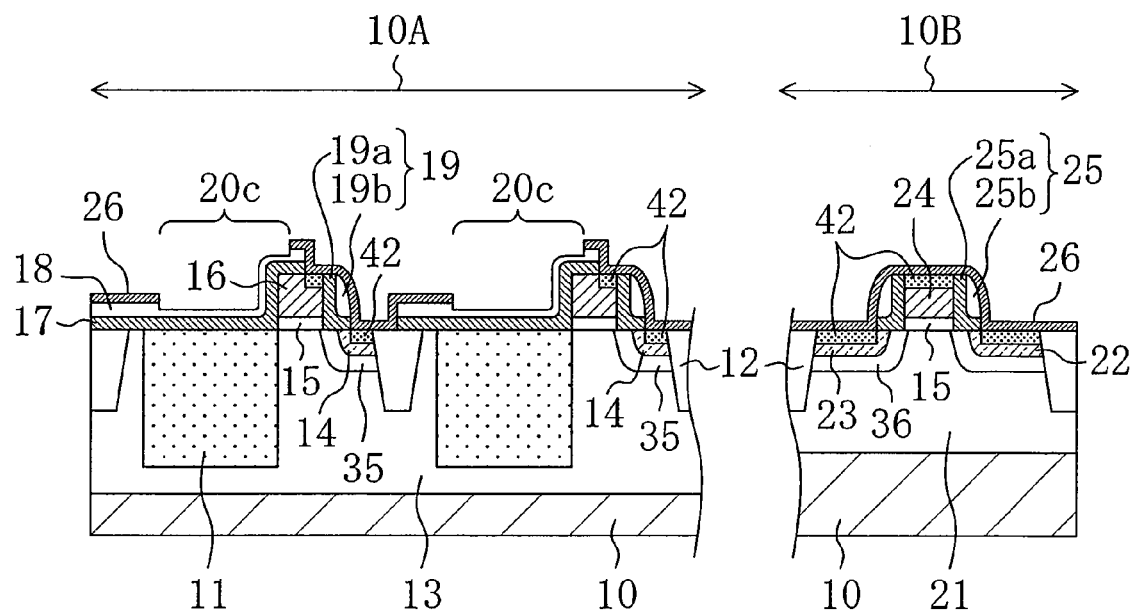

FIGS. 8A and 8B are views each showing a structure of the solid-state imaging element according to the fourth embodiment, specifically showing a CMOS image sensor as an example, of which 8A is a plan view, and FIG. 8B is a cross-sectional view corresponding to the line VIIIb-VIIIb of FIG. 8A.

The structure of the solid-state imaging element according to the present invention shown in FIGS. 8A and 8B is a combination of the above-mentioned structure of the solid-state imaging element according to the second embodiment shown in FIGS. 4A and 4B and the above-mentioned structure of the solid-state imaging element according to the third embodiment shown in FIGS. 6A and 6B.

That is, as shown in FIGS. 8A and 8B, in the structure of the solid-state imaging element according to the present embodiment, each of the silicon nitride films 18 has a thinner region 20c smaller in thickness than the end portion of the silicon nitride film 18 located over the isolation region 12 or over the upper surface of the corresponding gate electrode 16 of the transfer gate, and the thinner region 20c is located over at least a part of the upper surface of the corresponding photodiode 11, over the side surface of the corresponding gate electrode 16 of the transfer gate which is closer to the photodiode 11, and also over a part of the upper surface thereof in the same manner as in the second embodiment described above. In addition, in the same manner as in the third embodiment described above, the liner film 26 made of the silicon nitride film is formed over the entire surface of the silicon substrate 10, and the liner film 26 has the openings each for exposing the thinner portion of the corresponding silicon nitride film 18 formed over at least a part of the upper surface of the corresponding photodiode 11, over the side surface of the corresponding gate electrode 16 of the transfer gate which is closer to the photodiode 11, and also over a part of the upper surface thereof. The structure of the solid-state imaging element is otherwise the same as in the first embodiment described above, so that a description thereof will not be repeated. In the present embodiment, however, a configuration in which plural or multiple pixels compose one cell to share the transfer gate, the floating diffusion layer, the reset transistor, and the amplifier transistor is used as an example, as shown in FIG. 6A.

Next, a description will be given to a method for fabricating the solid-state imaging element according to the fourth embodiment.

Figure 9:
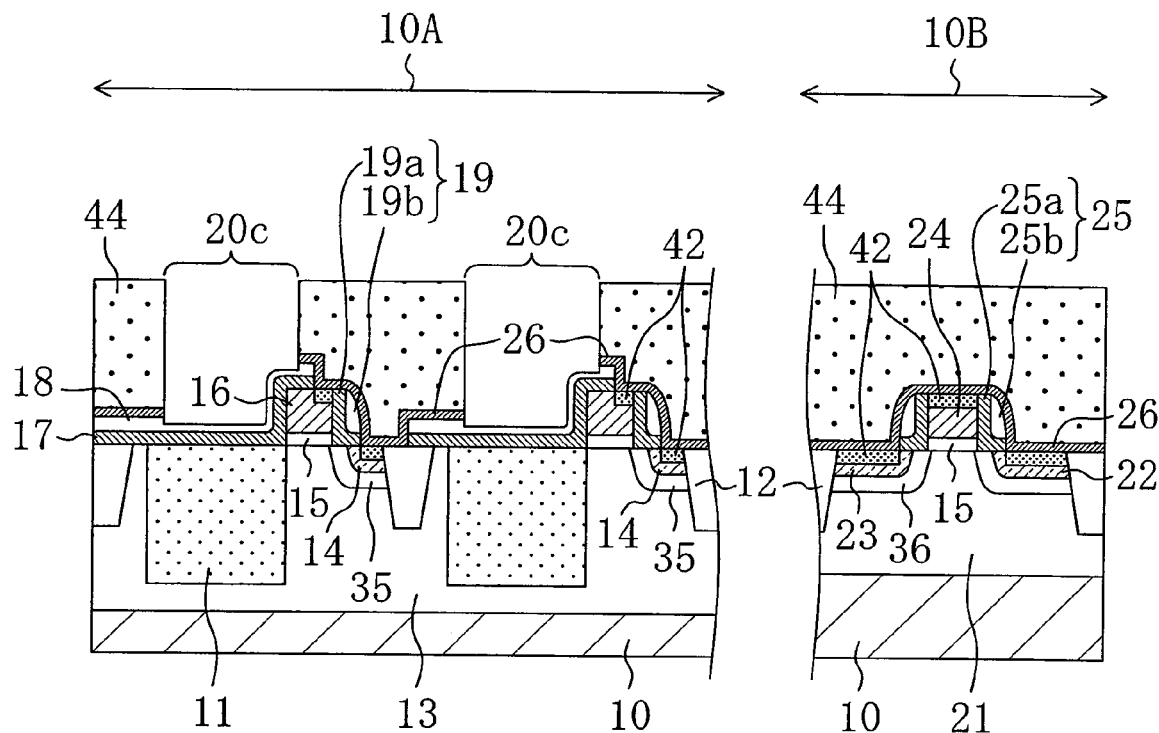
FIG. 9 is a cross-sectional view showing the process step of a method for fabricating the solid-state imaging element according to the fourth embodiment in correspondence to the line VIIIb-VIIIb of FIG. 8A.

FIG. 9 is a process cross-sectional view showing the process step of a method for fabricating the solid-state imaging element according to the fourth embodiment in correspondence to the line VIIIb-VIIIb of FIG. 8A. The method for fabricating the solid-state imaging element according to the present embodiment has a characteristic process step resulting from the characteristic structure of the solid-state imaging element described above with reference to FIGS. 8A and 8B, and the other process steps are the same as those of the method for fabricating the solid-state imaging element according to the first embodiment described above. Therefore, the following description will be given primarily to the characteristic portion.

In the present embodiment also, the above-mentioned structure shown in FIG. 1B is obtained in the same manner as in the description of the process steps shown in FIGS. 2A, 2B, 3A, and 3B in the first embodiment described above. Subsequently, the liner film 26 made of the silicon nitride film is formed over the entire surface of the silicon substrate 10 in the same manner as in the description of the process step shown in FIG. 7A in the second embodiment described above.

Next, as shown in FIG. 9, the resist pattern 44 is formed to expose the portion of the liner film 26 located over at least a part of the upper surface of each of the photodiodes 11, over the side surface of each of the gate electrodes 16 of the transfer gates which is closer to the photodiode 11, and also over a part of the upper surface thereof, and cover a part of the upper surface of each of the gate electrodes 16 of the transfer gates, the surface of each of the sidewall spacers 19, and the portion of each of the silicon nitride films 18 adjacent to the end portion thereof located over the isolation region 12 in the sensor region 10A, while it is formed to cover the entire surface of the silicon substrate 10 in the transistor region 10B. Subsequently, by dry etching using the resist pattern 44 as a mask, the liner film 26 is removed from at least a part of the upper surface of each of the photodiodes 11, from the side surface of each of the gate electrodes 16 of the transfer gates which is closer to the photodiode 11, and also from a part of the upper surface thereof in the sensor region 10A, while the thinner region 20c having a reduced thickness of about 40 nm is formed in each of the silicon nitride films 18. The thickness of each of the thinner portions of the silicon nitride film 18 is preferably in the range of not less than 30 nm and not more than 80 nm in the same manner as in the second embodiment.

Thus, the solid-state imaging element and the method for fabricating the same according to the fourth embodiment can achieve the effect of suppressing the occurrence of the degraded characteristics (a lower sensitivity, increased sensitivity variations, and an increased dark current) of the image sensor, similarly to those according to the first embodiment described above. In addition, since it is possible to freely adjust the thickness of each of the silicon nitride films 38 over the corresponding photodiode 11 such that the silicon nitride film 38 is thinned by etching over at least a part of the photodiode 11, the thickness required of the silicon nitride film 25b composing each of the sidewall spacer 25 and the optimum thickness required of the silicon nitride film 18 functioning as the antireflection film can be controlled independently of each other in a CMOS fabrication process, in the same manner as in the second embodiment described above. This allows the formation of the antireflection film having a sufficient antireflection effect on each of the photodiodes 11. Accordingly, it becomes easy to maintain or improve the sensitivity even when a pixel size is further reduced.

Additionally, when the salicide layers 42 are formed in the surface of the silicon substrate 10, the salicide layers 42 are not formed over the surfaces of the photodiodes 11, since the silicon nitride films 18 are present over the respective photodiodes 11 in the same manner as in the third embodiment described above. When the salicide layers are formed on the photodiodes, it may be considered that a leakage current may occur to cause the problems of an increased dark current or sensitivity variations, since not only the salicide layers hinder the transmission of incident light and degrade the sensitivity, but also cobalt atoms that are left without being silicidized induce a crystal defect in the silicon substrate in which the photodiodes are formed. However, the present invention can prevent such a situation.

Moreover, since it is possible to selectively remove only the liner film 26 made of a silicon nitride film formed on each of the photodiodes 11, when light is incident on the solid-state imaging element, the light can be effectively made incident only on the photodiode 11. On the other hand, the silicon nitride films 18 and the liner film 26 made of the silicon nitride film are formed in stacked relation in the region other than the regions where the photodiodes 11 are present so that the other region is less transmissive to the incident light. As a result, it becomes possible to suppress not only the phenomenon of color mixing caused by, e.g., the incidence of light on the isolation region 12 present between the adjacent photodiodes 11 (leakage of incident light to the adjacent photodiodes 11), but also a circuit misoperation caused by the incidence of intensive light on the peripheral CMOS circuit portion. To further suppress the transmission of light incident on the region other than the regions where the photodiodes 11 are present, a material lower in light transmission than a silicon nitride film and also usable for an etching stopper film can also be used as a material for composing the liner layer 26. For example, the liner layer 26 made of metal oxide such as alumina ($Al_2O_3$), or a hydrogenated silicon nitride compound ($SiO_xN_yH_z$) may be formed appropriately.

Further, since the thickness of the liner film 26 made of the silicon nitride film over each of the photodiodes 11 can be adjusted independently as described above, when an insulating film made of a material larger in film stress than silicon such as, e.g., a silicon nitride film is deposited as the insulating film over each of the photodiodes 11, it is possible to keep the amount of the film thickness reduction to a minimum required level, and thereby suppress a crystal defect in the silicon substrate 10 caused by the film stress. This also makes it possible to suppress the degraded characteristics (an increased dark current or a defect in an image) of the image sensor caused by a crystal defect present in the portion of the silicon substrate 10 located in the region where the photodiode 11 is formed.

Furthermore, in the method for fabricating the solid-state imaging element according to the present embodiment, the salicide layers 42, each made of cobalt silicide, are prevented from being exposed during the etching using the resist pattern 44 by forming the resist pattern 44 in the process step shown in FIG. 9 such that the position where the resist pattern 39 used in the process step of FIG. 3B is formed and the position where the resist pattern 44 shown in FIG. 9 is formed to overlap each other over each of the gate electrodes 16 of the transfer gates in the same manner as in the third embodiment described above. This can also achieve the effect of preventing metal contamination caused by cobalt not only in the solid-state imaging element according to the present embodiment, but also in fabrication equipment during etching and subsequent cleaning.

Although the present embodiment has described the case where the salicide layers 42, each made of cobalt silicide, are formed in each of the sensor region 10A and the transistor region 10B, the effects other than those related to the salicide layers mentioned above are also similarly obtainable even in a structure in which the salicide layers are provided only in the transistor region 10B composing the peripheral CMOS circuit portion, or in a structure where the salicide layers are not provided in either of the sensor region 10A and the transistor region 10B.

The present embodiment has described the case where the solid-state imaging element has a configuration in which multiple pixels compose one cell. However, the same effects as described above are obtainable even in the case where the solid-state imaging element has a configuration in which one pixel composes one cell so that the transfer gate, the floating diffusion layer, the reset transistor, and the amplifier transistor are not shared, in the same manner as in the first to third embodiments described above.

Each of the foregoing embodiments has described the case where each of the sidewall spacers 19 and 25 has a multilayer structure made of the silicon dioxide film 19*a* or 25*a* having the L-shaped cross-sectional configuration and the silicon nitride film 19*b* or 25*b* formed on the inner surface of the silicon dioxide film. However, each of the sidewall spacers 19 and 25 may also have a structure in which an insulating film having an I-shaped cross-sectional configuration is provided between the silicon dioxide film 19*a* or 25*a* having the L-shaped cross-sectional configuration and the corresponding gate electrode 16 or 24. In this case, the insulating film having the I-shaped cross-sectional configuration is formed also between the silicon dioxide film 17 and the side surface of the gate electrode 16 of the transfer gate which is closer to the corresponding photodiode, or the insulating film having the I-shaped cross-sectional configuration and composing each of the sidewall spacers covers the upper surface of the corresponding photodiode 11, and also a part of the upper surface of the corresponding gate electrode 16.

In each of the foregoing embodiments described above, the refractivity of each of the silicon nitride films 18 or the liner film 26 made of the silicon nitride film, each functioning as the antireflection film, is different from that of each of the underlying silicon dioxide films 17.

Thus, the present invention prevents the occurrence of the degraded characteristics (a lower sensitivity, increased sensitivity variations, and an increased dark current) of the image sensor even when a typical CMOS fabrication process is applied thereto, and further allows the optimization of the thickness of the antireflection film formed on each of the photodiodes without undergoing restrictions related to the fabrication process. Therefore, even when the number of pixels is further increased or a pixel size is further reduced, the present invention can maintain or improve the sensitivity, and is effective in improving the performance of the solid-state imaging element, reducing the area occupied thereby, and the like.

What is claimed is:

1. A solid-state imaging element comprising:
   a photodiode formed in an upper portion of a semiconductor substrate to perform a photoelectric conversion;
   a transfer gate including a gate electrode formed on the semiconductor substrate and adjacent to the photodiode;
   a first insulating film formed on the semiconductor substrate to cover the photodiode;
   a second insulating film formed on the first insulating film and a part of the gate electrode and in contact with the first insulating film, wherein the second insulating film has a thinner portion smaller in thickness than at least an end portion of the second insulating film, the thinner portion of the second insulating film being entirely or partly over the photodiode; and
   a third insulating film formed on the semiconductor substrate and a part of the gate electrode and having an opening so that the third insulating film is absent above the entire regions of the thinner portion of the second insulating film,
   wherein the first insulating film is formed on a part of, but not an entirety of, a top of the gate electrode of the transfer gate.

2. The solid-state imaging element of claim 1, wherein the thinner portion of the second insulating film smaller in thickness than at least the end portion of the second insulating film is the portion of the second insulating film exposed in the opening.

3. The solid-state imaging element of claim 1, wherein
   a refractivity of the second insulating film is different from that of the first insulating film, and
   a thickness of the second insulating film is not less than 30 nm, and not more than 80 nm.

4. The solid-state imaging element of claim 1, wherein
   the first insulating film is made of a silicon dioxide film, and
   the second insulating film is made of a silicon nitride film.

5. The solid-state imaging element of claim 1, wherein the third insulating film is made of a silicon nitride film.

6. The solid-state imaging element of claim 1, wherein the substrate is n-type.

7. The solid-state imaging element of claim 6 further comprising a p-type well formed in the substrate.

8. The solid-state imaging element of claim 1, wherein the first insulating film is formed on a side face of the gate electrode opposite to the photodiode.

9. The solid-state imaging element of claim 1, wherein the second insulating film is formed on a side face of the gate electrode opposite to the photodiode.

10. The solid-state imaging element of claim 1, wherein the third insulating film is formed on a floating diffusion in an upper portion of the semiconductor substrate located on a side of gate electrode opposite to the photodiode.

11. The solid-state imaging element of claim 10, wherein the floating diffusion has a salicide layer.

12. The solid-state imaging element of claim 1, wherein the third insulating film is made of a material larger in film stress than silicon.

13. The solid-state imaging element of claim 1, wherein the third insulating film is overlapping the second insulating film.

14. The solid-state imaging element of claim 1, wherein the third insulating film is made of a silicon nitride film.

15. The solid-state imaging element of claim 1, wherein the third insulating film is made of a hydrogenated silicon nitride compound film.

16. The solid-state imaging element of claim 1, wherein the gate electrode has a salicide layer.

17. The solid-state imaging element of claim 1, wherein:
    the transfer gate includes a gate insulating film, and
    the transfer gate is disposed adjacent to the photodiode without interposing an isolation region.

* * * * *